(12) United States Patent
Kim et al.

(10) Patent No.: US 11,367,769 B2
(45) Date of Patent: Jun. 21, 2022

(54) DISPLAY DEVICE COMPRISING DATA LINE ARRANGEMENT AROUND A THROUGH PORTION

(71) Applicant: Samsung Display Co., Ltd., Yongin-si (KR)

(72) Inventors: Sunkwang Kim, Yongin-si (KR); Kinyeng Kang, Yongin-si (KR); Jonghyun Choi, Yongin-si (KR); Suyeon Sim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 16/570,945

(22) Filed: Sep. 13, 2019

(65) Prior Publication Data

US 2020/0013849 A1    Jan. 9, 2020

Related U.S. Application Data

(63) Continuation of application No. 15/284,562, filed on Oct. 4, 2016, now Pat. No. 10,418,434.

(30) Foreign Application Priority Data

Mar. 31, 2016  (KR) .......................... 10-2016-0039328

(51) Int. Cl.
*H01L 27/32* (2006.01)
*H01L 27/12* (2006.01)

(52) U.S. Cl.
CPC ........ *H01L 27/3276* (2013.01); *H01L 27/124* (2013.01); *H01L 27/3248* (2013.01); *H01L 27/3262* (2013.01); *H01L 27/326* (2013.01); *H01L 27/3223* (2013.01)

(58) Field of Classification Search
CPC . H01L 27/124; H01L 27/3223; H01L 27/326; H01L 27/3262; H01L 27/3276; H01L 27/3248
See application file for complete search history.

(56) References Cited

U.S. PATENT DOCUMENTS

| | | | |
|---|---|---|---|
| 5,654,970 A | * | 8/1997 | DaCosta ............ G01R 31/2815 714/25 |
| 8,827,536 B2 | | 9/2014 | Lee et al. |
| 2008/0002332 A1 | | 1/2008 | Chen |

(Continued)

FOREIGN PATENT DOCUMENTS

| | | | |
|---|---|---|---|
| CN | 107221281 A | * | 9/2017 |
| JP | 2009-047902 A | | 3/2009 |

(Continued)

*Primary Examiner* — Herve-Louis Y Assouman
*Assistant Examiner* — Christopher M Roland
(74) *Attorney, Agent, or Firm* — Lewis Roca Rothgerber Christie LLP

(57) ABSTRACT

A display device includes a through portion passing through a display layer. The display includes a plurality of scan lines above the substrate and extending in a first direction, a plurality of data lines extending in a second direction, and a plurality of pixels connected to the scan lines and data lines. The data lines include a first data line and a second data line disconnected by the through portion, and a third data line spaced apart from the through portion along the first direction. The first data line is electrically connected with the third data line.

25 Claims, 17 Drawing Sheets

(56) References Cited

U.S. PATENT DOCUMENTS

| | | |
|---|---|---|
| 2008/0117497 A1 | 5/2008 | Shimodaira |
| 2008/0225216 A1 | 9/2008 | Shimodaira |
| 2009/0051636 A1 | 2/2009 | Natori |
| 2010/0026611 A1 | 2/2010 | Igeta et al. |
| 2010/0265233 A1* | 10/2010 | Omoto ................. G09G 3/3233 345/55 |
| 2013/0193439 A1* | 8/2013 | Ahn .................... H01L 27/1255 257/59 |
| 2014/0197428 A1* | 7/2014 | Wang ...................... G07F 17/32 257/88 |
| 2014/0300837 A1 | 10/2014 | Gates et al. |
| 2015/0014650 A1 | 1/2015 | Lim et al. |
| 2017/0154566 A1* | 6/2017 | Ryoo ......................... G02F 1/13 |
| 2017/0162111 A1 | 6/2017 | Kang et al. |
| 2017/0162637 A1 | 6/2017 | Choi et al. |
| 2018/0366495 A1* | 12/2018 | Xu ........................ H01L 27/124 |

FOREIGN PATENT DOCUMENTS

| | | |
|---|---|---|
| JP | 2010-32760 A | 2/2010 |
| KR | 10-2008-0084676 A | 9/2008 |
| KR | 10-1212172 B1 | 12/2012 |
| KR | 10-2013-0027335 A | 3/2013 |

* cited by examiner

DISPLAY DEVICE COMPRISING DATA LINE ARRANGEMENT AROUND A THROUGH PORTION

CROSS-REFERENCE TO RELATED APPLICATION

This application is a continuation of U.S. application Ser. No. 15/284,562, filed on Oct. 4, 2016, now U.S. Pat. No. 10,418,434, issued on Sep. 17, 2019, which claims priority to and the benefit of Korean Patent Application No. 10-2016-0039328, filed on Mar. 31, 2016, and entitled, "Display Device," both of which are herein incorporated by reference in their entirety.

BACKGROUND

1. Field

One or more embodiments described herein relate to a display device.

2. Description of the Related Art

Display devices are designed to be thin and lightweight in order to make them more convenient to use. They also have various shapes depending, for example, on their intended applications or to meet certain aesthetic goals.

SUMMARY

In accordance with one or more embodiments, a display device includes a substrate; a display layer on the substrate, the display layer includes a plurality of scan lines extending in a first direction, a plurality of data lines extending in a second direction crossing the first direction, and a plurality of pixels connected to the plurality of scan lines and the plurality of data lines; and a through portion passing through the substrate and the display layer, wherein the plurality of data lines include a first data line and a second data line disconnected by the through portion and a third data line spaced apart from the through portion along the first direction, and wherein the first data line is electrically connected with the third data line.

The first data line and the second data line may be spaced apart from each other in the second direction, with the through portion therebetween. The substrate may include a display area including the display layer and a non-display area surrounding the display area. The display device may include a data connection line to connect the first data line to the third data line. The data connection line may be integrally formed with the first data line and the third data line and may include a same material as the first data line and the third data line. The data connection line may be bent in the non-display area.

At least a partial region of the non-display area may be bent with respect to the display area. The display device may includes an insulating layer between the data connection line and the first and third data lines, and the data connection line may be connected to the first data line and the third data line via a contact hole passing through the insulating layer. The data connection line may be in the display area.

The plurality of data lines may include a fourth data line spaced apart from the through portion along the first direction, and the third data line may be between the through portion and fourth data line, and the fourth data line may extend toward an edge of the substrate. The display device may include a metallic layer to induce parasitic capacitance between an extended portion of the fourth data line and the metallic layer.

The plurality of pixels may include a first pixel connected to the first data line; a second pixel connected to the second data line; and a third pixel connected to the third data line and in a row in which the first pixel is disposed, and wherein a data signal of the first pixel is equal to a data signal of the third pixel.

The display device may include an insulating layer between a scan line connected to the first pixel and a scan line connected to the third pixel. Each of the first pixel and the third pixel may include a thin film transistor (TFT) which includes a semiconductor layer, a gate electrode, a source electrode, and a drain electrode, and the gate electrode of the TFT of the first pixel and the gate electrode of the TFT of the third pixel may include a same material.

A scan signal of the first pixel may be independent from a scan signal of the third pixel. The display device may include a data driver connected to the plurality of data lines, and the second data line may be closer to the data driver than the first data line. Each of the plurality of pixels may include a pixel circuit including a thin film transistor (TFT) and a storage capacitor and a display element connected to the pixel circuit. The display element may include an organic light-emitting diode (OLED). An outer edge of the through portion may at least partially surrounded by the plurality of pixels. The through portion may extend toward an edge of the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
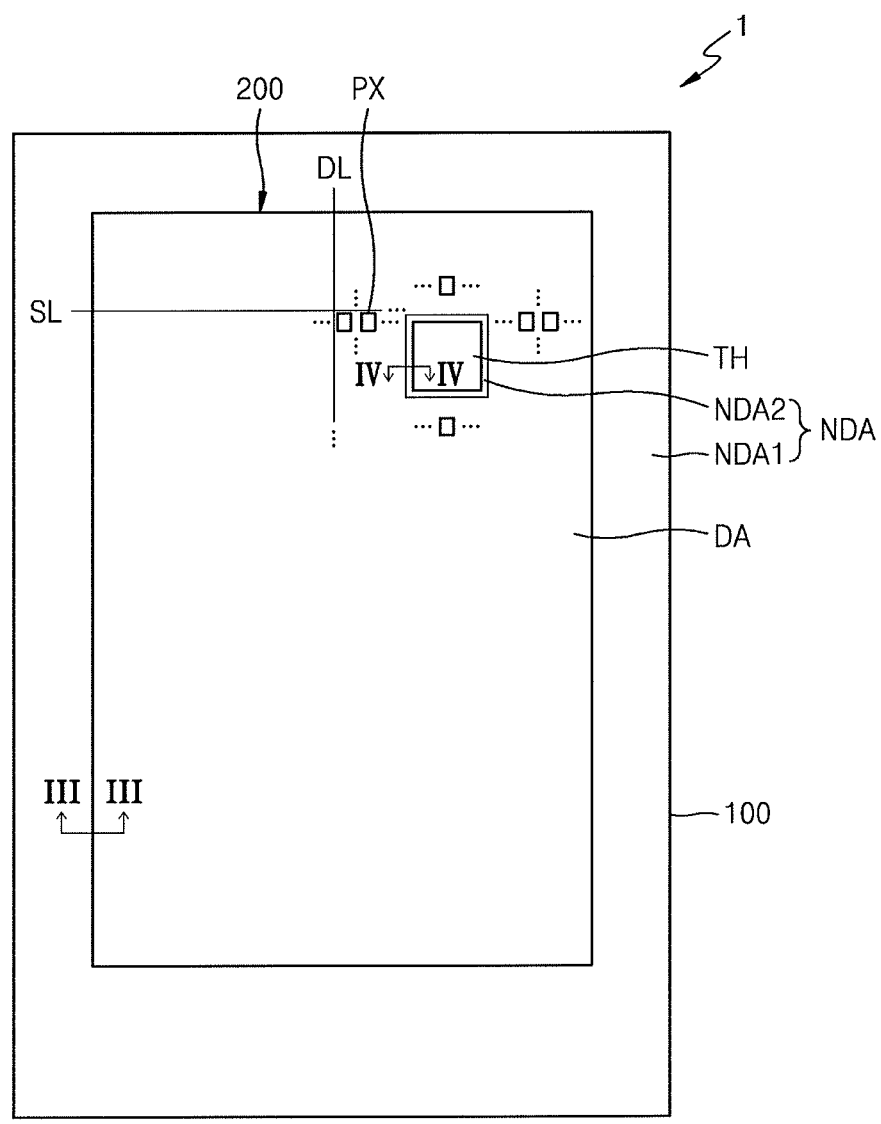
FIG. 1 illustrates an embodiment of a display device.
Figure 1:
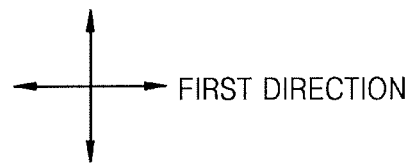

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
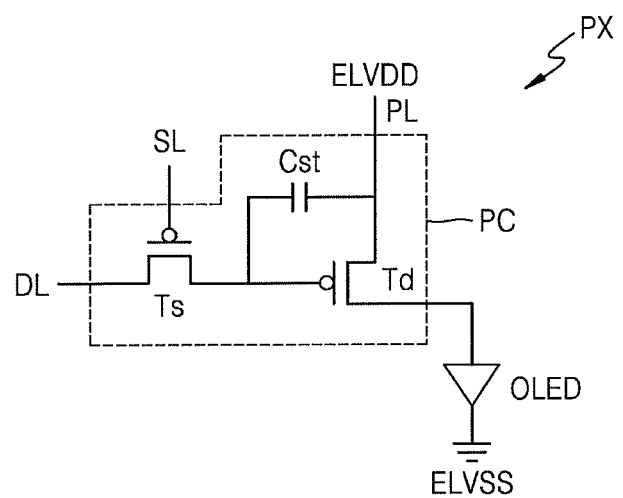
FIG. 2 illustrates an embodiment of a pixel.
Figure 3:
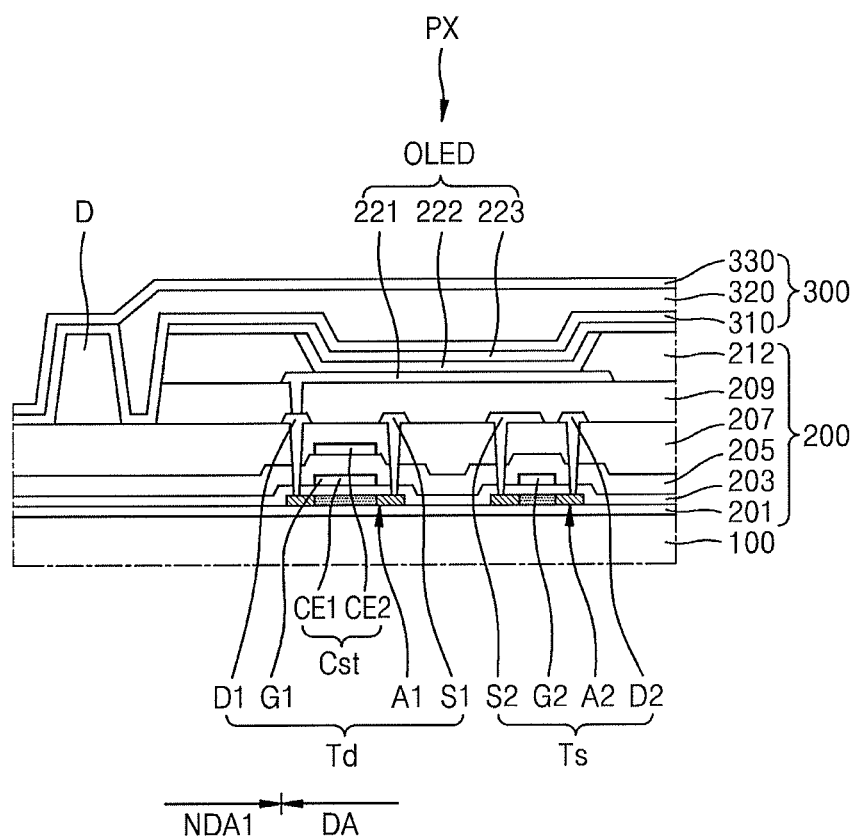
FIG. 3 illustrates a view taken along section line III-III in FIG. 1.
Figure 4:
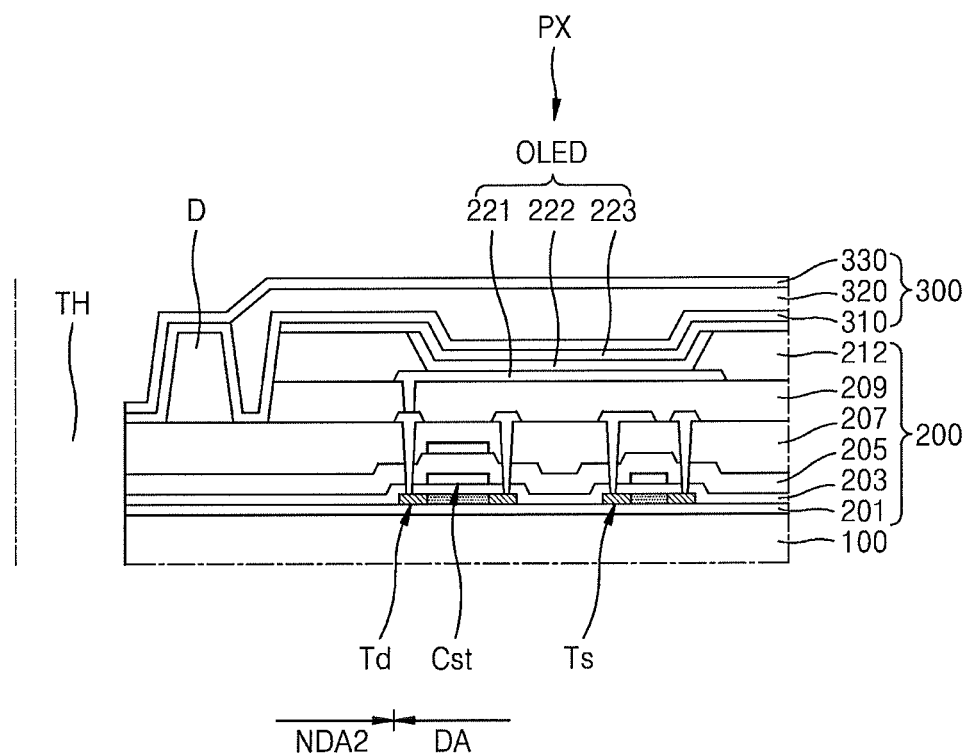
FIG. 4 illustrates a view taken along section line IV-IV in FIG. 1.

FIG. 1 illustrates an embodiment of a display device 1, FIG. 2 illustrates an embodiment of an equivalent circuit a pixel in the display device 1, and FIGS. 3 and 4 are cross-sectional views taken along line III-III and IV-IV in FIG. 1, respectively.

Referring to FIG. 1, the display device 1 includes a substrate 100, a display unit (display layer) 200 above the substrate 100, and a through portion TH passing through the display unit 200. The substrate 100 includes a display area DA and a non-display area NDA. The display area DA provides an image, and the display unit 200 is above display area DA.

The display unit 200 includes a scan line SL extending in a first direction, a data line DL extending in a second direction crossing the first direction, and pixels PX respectively located at intersection regions of the scan line SL and the data line DL. The display unit 200 outputs a predetermined image based on light emitted from light-emitting devices of each of a plurality of pixels PX. The pixels PX of the display unit 200 define the display area DA.

Referring to FIG. 2, a representative embodiment of an equivalent circuit for each of the pixels PX includes a pixel circuit PC coupled to an organic light-emitting diode (OLED), which constitutes a display element.

The pixel circuit PC includes a switching thin film transistor (TFT) Ts, a driving TFT Td, and a storage capacitor Cst. The switching TFT Ts is connected to the scan line SL and the data line DL, and transfers a data voltage from the data line DL to the driving TFT Td depending on a switching voltage input from the scan line SL.

The storage capacitor Cst is connected to the switching TFT Ts and a driving power line PL, and stores a voltage corresponding to a difference between a voltage transmitted from the switching TFT Ts and a voltage ELVDD supplied to the driving power line PL.

The driving TFT Td is connected to the driving power line PL and the storage capacitor Cst, and controls a driving current flowing through the OLED from the driving power line PL in response to a voltage value stored in the storage capacitor Cst. The OLED may emit light having predetermined brightness by using the driving current.

FIG. 2 illustrates just one example of an equivalent circuit of the pixels PX in the display device 1. The number of TFTs and/or the number of capacitors may be different in other embodiments. For example, depending on resolution, one or more TFTs may be included for transferring signals (e.g., a compensation signal or an initialization signal) in addition to the signals for driving and switching TFTs Td and Ts.

Referring again to FIG. 1, the through portion TH is located inside the display area DA. An outer edge of the through portion TH may be completely surrounded by the pixels PX. In one embodiment, the through portion TH may be a hole passing through layers forming the substrate 100 and the display unit 200 in a thickness direction. A camera, a sensor, a speaker, a microphone, etc. may be mounted in the through portion TH. Alternatively, the through portion TH may be a space for a separate member for the function of the display device 1 or a separate member that may add a new function. In FIG. 1, the through portion TH is rectangular. In another embodiment, the through portion TH may have a different shape including but not limited to a polygon, a triangle, a circle, or an ellipse. Also, the number and location of through portions TH may be different in other embodiments.

The non-display area NDA does not provide an image, and includes a first sub-non-display area NDA1 surrounding the outer edge of the display area DA and a second sub-non-display area NDA2 surrounding the outer edge of the through portion TH.

A driver (such as a scan driver and/or a data driver) for transferring predetermined signals to each pixel PX of the display area DA may be in the first sub-non-display area NDA1. The second sub-non-display area NDA2 may be between the through portion TH and the display area DA.

Referring to FIG. 3, the display unit 200 is above the substrate 100 and an encapsulation layer 300 covers the display unit 200. The substrate 100 may include a material such as glass, metal, or an organic material. According to an embodiment, the substrate 100 may include a flexible material, e.g., polyimide (PI).

The display unit 200 includes a pixel circuit layer and a device layer. The pixel circuit layer includes the above-described driving and switching TFTs Td and Ts, a storage capacitor Cst, and wirings. The device layer includes the OLED. Also, a plurality of insulating layers may be located between these layers. The layers of the display unit 200 are described according to a stacking sequence.

A buffer layer 201 may reduce or block penetration of foreign substance, moisture, or external air from below the substrate 100, and may provide a planarization surface above the substrate 100. The buffer layer 201 may include an inorganic material such as an oxide layer (e.g. SiOx) or a nitride layer (e.g. SiNx), an organic material, or an organic-inorganic composite material. In one embodiment, the buffer layer 201 may include a single-layered or multi-layered structure of an inorganic material and an organic material.

The driving TFT Td includes a semiconductor layer A1, a gate electrode G1, a source electrode S1, and a drain electrode D1. The switching TFT Ts includes a semiconductor layer A2, a gate electrode G2, a source electrode S2, and a drain electrode D2. In FIG. 3, top gate-type TFTs are illustrated in which the gate electrodes G1 and G2 of the driving and switching TFTs Td and Ts are above the semiconductor layers A1 and A2. In another embodiment, the driving and switching TFTs Td and Ts may be bottom gate-type TFTs.

In an embodiment, the semiconductor layers A1 and A2 may include, for example, amorphous silicon or include polycrystalline silicon. In another embodiment, the semiconductor layers A1 and A2 may include an oxide of at least one of In, Ga, Sn, Zr, V, Hf, Cd, Ge, Cr, Ti, or Zn. The semiconductor layers A1 and A2 may include a channel region and a source region and a drain region doped with impurities.

A gate insulating layer 203 may be above the semiconductor layers A1 and A2 and may cover the semiconductor layers A1 and A2. The gate insulating layer 203 may include an inorganic material, e.g., an oxide or a nitride. For example, the gate insulating layer 203 may include, for example, SiOx, SiNx, SiON, $Al_2O_3$, $TiO_2$, $Ta_2O_5$, $HfO_2$, $ZnO_2$, etc.

The gate electrodes G1 and G2 may include a metallic material having a low resistance. For example, the gate electrodes G1 and G2 may include Mo, Al, Cu, Ti, etc. and may include a single layer or a multi-layer.

According to an embodiment, the gate electrode G1 of the driving TFT Td may be a first electrode CE1 of a storage capacitor Cst.

A first interlayer insulating layer 205 may be above the first electrode CE1 and may cover the first electrode CE1. For example, the first interlayer insulating layer 205 may include, for example, SiOx, SiNx, SiON, $Al_2O_3$, $TiO_2$, $Ta_2O_5$, $HfO_2$, $ZnO_2$, etc.

A second electrode CE2 may be above the first interlayer insulating layer 205 and may overlap the first electrode CE1, with the interlayer insulating layer 205 therebetween. The second electrode CE2 may include a conductive material including Mo, Al, Cu, Ti, etc., and include a single layer or a multi-layer of these materials.

A second interlayer insulating layer 207 may be above the second electrode CE2 and may overlap the second electrode CE2. For example, the second interlayer insulating layer 207 may include, for example, SiOx, SiNx, SiON, $Al_2O_3$, $TiO_2$, $Ta_2O_5$, $HfO_2$, $ZnO_2$, etc.

The source electrodes S1 and S2 and the drain electrodes D1 and D2 may respectively contact source regions and drain regions of the semiconductor layers A1 and A2 via contact holes. The source electrodes S1 and S2 and the drain electrodes D1 and D2 may include a material having excellent conductivity. For example, the source electrodes S1 and S2 and the drain electrodes D1 and D2 may include a conductive material including Mo, Al, Cu, Ti, etc., and may include a single layer or a multi-layer of these materials. In an embodiment, the source electrodes S1 and S2 and the drain electrodes D1 and D2 may include a multi-layered structure of Ti/Al/Ti.

A planarization layer 209 covers the source electrodes S1 and S2 and the drain electrodes D1 and D2. The planarization layer 209 may include a single layer or a multi-layer of an organic material. For example, the planarization layer 209 may include a general purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. Also, in one embodiment, the planarization layer 209 may include a composite stacked layer of an inorganic insulating layer and an organic insulating layer.

A pixel electrode 221 may be connected to the driving TFT Td through a via hole of the planarization layer 209. The pixel electrode 221 may be exposed via an opening of a pixel-defining layer 212. The pixel-defining layer 212 may cover the edge of the pixel electrode 221. In an embodiment, the pixel electrode 221 may include a reflective electrode and, for example, may include Ag, Mg, Al, Pt, Pd, Au, Ni, Nd, Ir, Cr, or a compound thereof.

An intermediate layer 222 includes an organic emission layer above a portion of the pixel electrode 221 exposed by the pixel-defining layer 212. The organic emission layer may be a low molecular organic material or a polymer organic material. The intermediate layer 222 may further selectively include a functional layer, e.g., a hole transport layer (HTL), a hole injection layer (HIL), an electron transport layer (ETL), and an electron injection layer (EIL).

An opposite electrode 223 may be a transparent or a semi-transparent electrode. For example, the opposite electrode 223 may include a metallic thin film having a small work function and including Li, Ca, LiF/Ca, LiF/Al, Al, Ag, Mg, and a compound thereof. In one embodiment, the opposite electrode 223 may include a transparent conductive oxide (TCO) such as an indium tin oxide (ITO), an indium zinc oxide (IZO), a zinc oxide (ZnO), $In_2O_3$, an indium gallium oxide (IGO), or an aluminum zinc oxide (AZO). In one embodiment, the opposite electrode 223 may have a multi-layered structure in which the above-described transparent conductive oxide is stacked above the metallic thin film. In an embodiment, the opposite electrode 223 may include a thin film metallic layer including Ag and Mg.

An encapsulation layer 300 prevents external moisture and oxygen from penetrating into the display unit 200 by covering the display unit 200. The encapsulation layer 300 may be a multi-layer including inorganic layers 310 and 330 and an organic layer 320. The organic layer 320 and the inorganic layers 310 and 330 of the encapsulation layer 300 may be alternately stacked. In FIG. 3, the encapsulation layer 300 includes the two inorganic layers 310 and 330 and one organic layer 320. In one embodiment, the encapsulation layer 300 may further include a plurality of alternately disposed additional inorganic and organic layers. The number of times the layers are stacked may vary in different embodiments.

The inorganic layers 310 and 330 may include at least one of SiNx, AlN, ZrN, TiN, HfN, TaN, SiOx, $Al_2O_3$, $TiO_2$, $SnO_2$, $CeO_2$, or SiON. The inorganic layers 310 and 330 may be formed using, for example, a chemical vapor deposition (CVD) process.

The organic layer 320 may include at least one of an acryl-based resin, a methacryl-based resin, a polyisoprene, a vinyl-based resin, an epoxy-base resin, a urethane-based resin, a cellulose-based resin, or a perylene-based resin. In an embodiment, the organic layer 320 may be formed by depositing a liquid monomer and then curing the liquid monomer using heat or light such as an ultraviolet ray.

To prevent the liquid monomer from flowing toward the end of the substrate 100 and prevent an edge tail of the organic layer 320 from being formed, a dam D may be disposed in the first sub-non-display area NDA1. The dam D may include, for example, the same material as the planarization layer 209 and/or the pixel-defining layer 212.

The inorganic layers 310 and 330 may have a larger area than the organic layer 320. Therefore, the inorganic layers 310 and 330 may contact each other, and thus more effectively prevent penetration of external oxygen or moisture.

Referring to FIG. 4, a structure, in which the display unit 200 is located in the display area DA of the substrate 100 and the encapsulation 300 covers the display unit 200, may be substantially same as the stacked structure in FIG. 3.

A through portion TH may correspond to a second-non-display area NDA2 of the substrate 100. A dam D may be between the through portion TH and a pixel PX of the display unit 200. The dam D may prevent an edge tail of the organic layer 320 from forming as described above. The inorganic layers 310 and 330 may extend further toward the through portion TH than the organic layer 320 and may contact each other in a region adjacent to the through portion TH.

Figure 5:
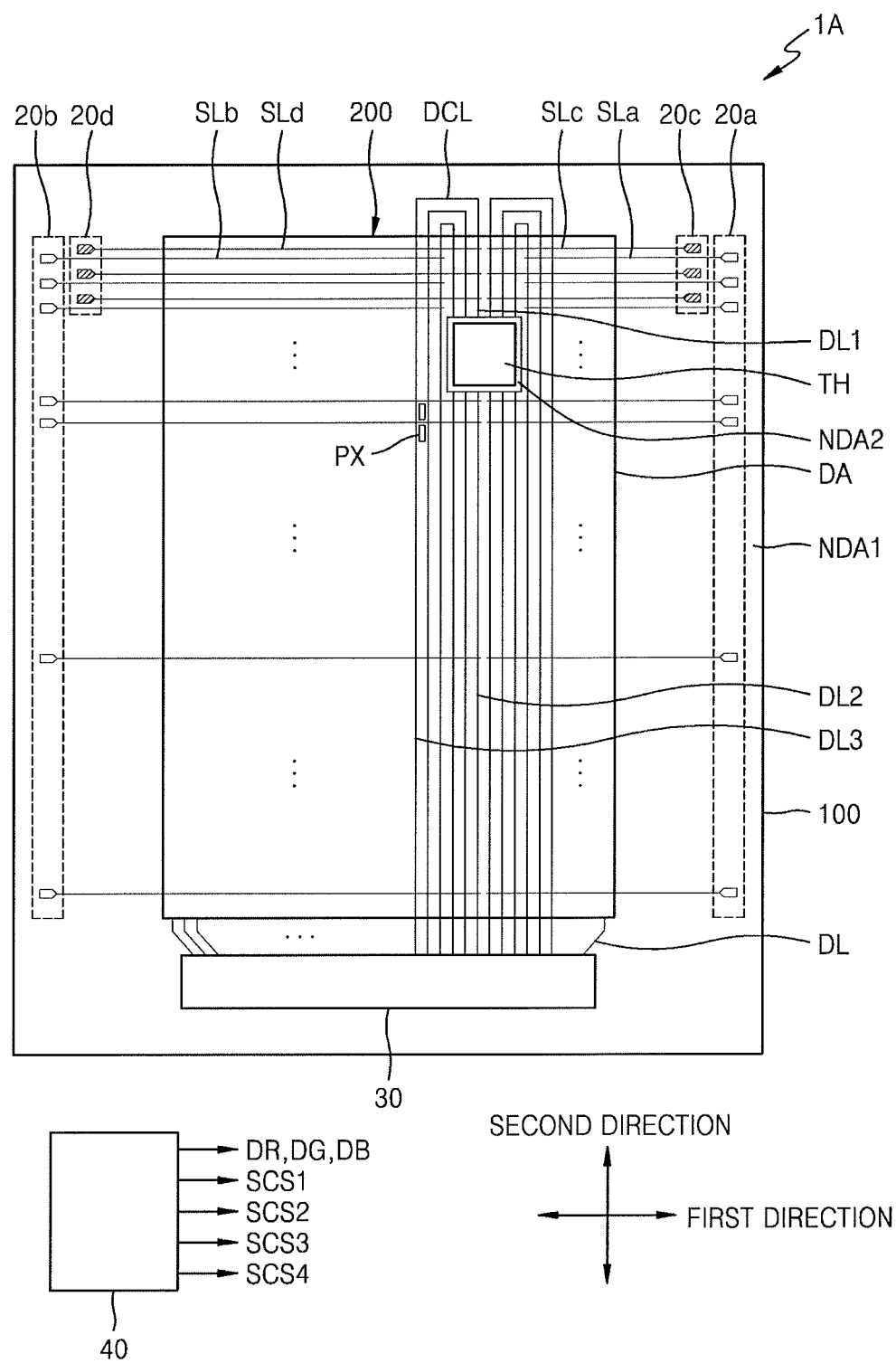
FIG. 5 illustrates another embodiment of a display device.
Figure 6:
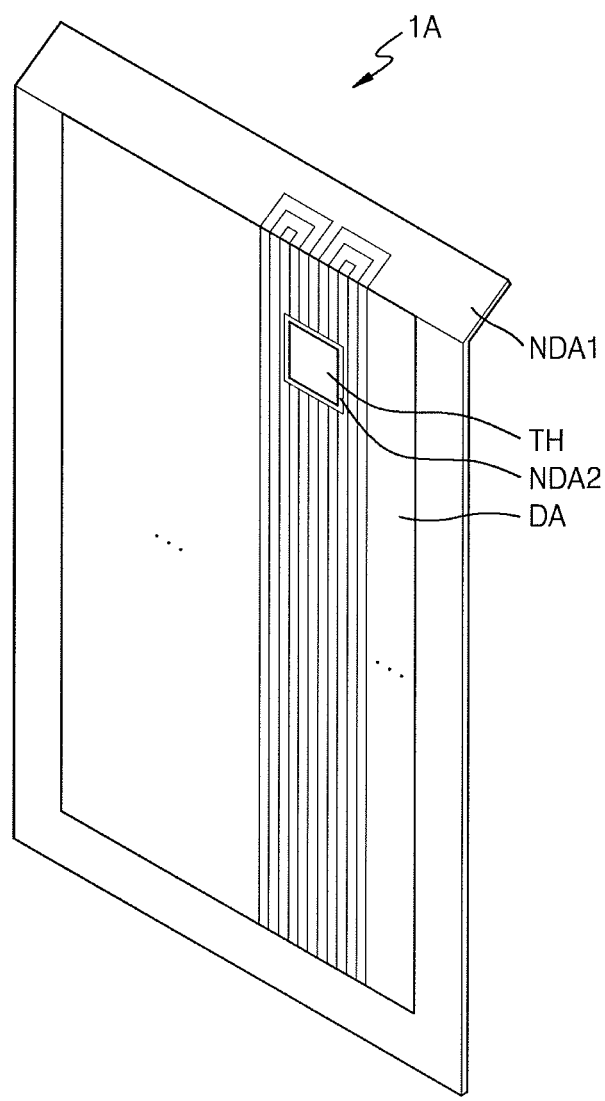
FIG. 6 illustrates another view of the display device in FIG. 5.

FIG. 5 illustrates another embodiment of a display device 1A, and FIG. 6 illustrates another view of the display device 1A. Referring to FIG. 5, a display unit 200 is located in a display area DA of the display device 1A. Also, a through portion TH passing through the substrate 100 and the display unit 200 is inside the display area DA. A non-display area NDA includes a first sub-non-display area NDA1 and a second sub-non-display area NDA2 surrounding the through portion TH as described above.

First to fourth scan drivers 20a, 20b, 20c, and 20d, and a data driver 30 are in the first sub-non-display area NDA1. Scan lines SLa, SLb, SLc, and SLd connected to the first to fourth scan drivers 20a, 20b, 20c, and 20d, and a data line DL connected to the data driver 30 are connected to pixels PX in the display area DA.

Some of the pixels PX receive a scan signal from the first scan driver 20a via the scan line SLa. Some of the pixels PX receive a scan signal from the second scan driver 20b via the scan line SLb. Some of the pixels PX receive a scan signal from the third scan driver 20c. Remaining ones of the pixels PX may receive a scan signal from the fourth scan driver 20d.

The first to fourth scan drivers 20a, 20b, 20c, and 20d may be at respective sides of the display unit 200. For example, the first and second scan drivers 20a and 20b may be spaced apart from each other in the first sub-non-display area NDA1, with the display unit 200 therebetween. The third and fourth scan drivers 20c and 20d may be spaced apart from each other in the first sub-non-display area NDA1, with the display unit 200 therebetween.

The data driver 30 has an integrated circuit (IC) chip shape mounted in a pad portion coupled to the substrate 100. The data driver 30 provides data signals to the pixels PX via corresponding data lines DL.

The controller 40 may convert image signals from a source to image data signals DR, DG, and DB for input into the data driver 30. Also, the controller 40 may receive a synchronization signal and a clock signal and generate control signals SCS1, SCS2, SCS3, and SCS4 for controlling the first to fourth scan drivers 20a, 20b, 20c, and 20d, respectively.

The data lines DL extend in a second direction from the data driver 30. Some of the data lines DL are disconnected by the through portion TH. In one embodiment, some data lines DL that overlap the through portion TH are disconnected by the through portion TH. For example, in the plan view of FIG. 5, data lines DL1 (first data lines) above the through portion TH are disconnected from data lines DL2 (second data lines) below the through portion TH. In contrast, some data lines DL spaced apart from the through portion TH extend across the display area DA in a second direction without disconnection.

The second data lines DL2 are connected to the data driver 30 and transfer predetermined data signals to relevant pixels PX connected to the second data lines DL2. In contrast, the first data lines DL1 are connected to data lines DL3 (third data lines), which are spaced apart from the through portion TH in the first direction, via data connection lines DCL. The data connection lines DCL are in a part (one region) of the first sub-non-display area NDA1. The one region of the first sub-non-display area NDA1 in which the data connection lines DCL are located may be bent with respect to the display area DA.

Referring to FIG. 6, when the substrate 100 includes a flexible material, the one region of the substrate 100 that corresponds to the data connection line DCL may be bent with respect to the display area DA of the substrate 100.

Figure 7:
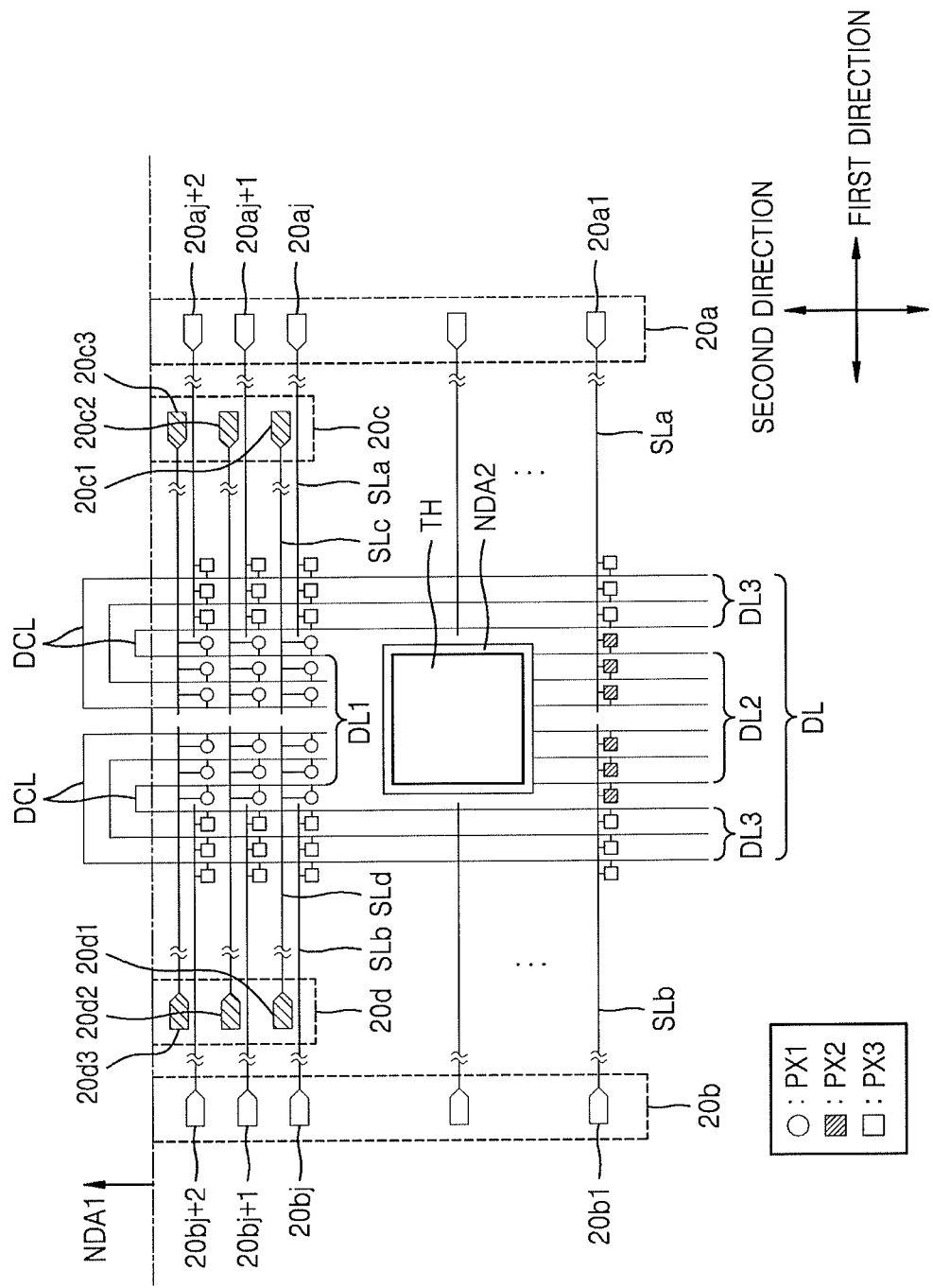
FIG. 7 illustrates an enlarged area including the through portion in FIG. 5.

FIG. 7 illustrates an enlarged area of through portion TH in FIG. 5. Referring to FIG. 7, data lines DL extend in a second direction and include first data lines DL1 and second data lines DL2 disconnected by the through portion TH and third data lines DL3 spaced apart, in a first direction, from through portion TH and crossing display area DA.

The first data lines DL1 are at a portion (e.g., a portion above the through portion) away from the data driver 30 (e.g., see FIG. 5), with the through portion TH therebetween, in a plane view. The first data lines DL1 are connected to the third data lines DL3 by data connection lines DCL. Since a data signal generated by the data driver 30 moves along the third data line DL3, the data connection line DCL, and the first data line DL1, a pixel PX1 (e.g., a first pixel) connected to the first data line DL1 receives the same data signal as a pixel PX3 (e.g., a third pixel) connected to the third data line DL3.

The data connection line DCL is bent from a first sub-non-display area NDA1. For example, the data connection line DCL may be integrally formed with the first and second data lines DL1 and DL3 and may include, for example, the same material as those of the first and second data lines DL1 and DL3. In another embodiment, the data connection lines DCL may be in layers different from the first and third data lines DL1 and DL3 and may be electrically connected to the first and third data lines DL1 and DL3 via contact holes, respectively.

The second data line DL2 is connected to the data driver 30 and directly receives a data signal from the data driver 30. A signal generated by the data driver 30 is provided to a pixel PX2 (e.g., a second pixel) connected to the second data line DL2 via the second data line DL2.

A data signal applied to the first pixel PX1 may be different from a data signal applied to the second pixel PX2, and may be the same as a data signal applied to the third pixel PX3. If the first pixel PX1 and the third pixel PX3 in the same row receive the same scan signal via the same scan line, the first pixel PX1 and the third pixel PX3 cannot be controlled independently, and thus it is difficult to form various images. To prevent this, the first pixel PX1 and the third pixel PX3 in the same row may be connected to different scan lines and independently turned on/off.

Some of the first pixels PX1 are turned on/off by a scan signal from a third scan driver 20c via a scan line SLc. Remaining ones of the first pixels PX1 are turned on/off by a scan signal from a fourth scan driver 20d via a scan line SLd.

Some of the second pixels PX2 are turned on/off by a scan signal from a first scan driver 20a via a scan line SLa. Remaining ones of the second pixels PX2 are turned on/off by a scan signal from a second scan driver 20b via a scan line SLb.

Some of the third pixels PX3 are turned on/off by a scan signal from the first scan driver 20a via the scan line SLa. Remaining ones of the third pixels PX3 are turned on/off by a scan signal from the second scan driver 20b via the scan line SLb.

As described above, the first pixel PX1 and the third pixel PX3 receive different scan signals via different scan lines. Thus, even though the first pixel PX1 receives the same data signal as the third pixel PX3, the first pixel PX1 and the third pixel PX3 may emit light independently.

According to an embodiment, scan signals may be provided in a sequence from the first scan driver 20a to the third scan driver 20c, and in a sequence from the second scan driver 20b to the fourth scan driver 20d. For example, scan signals applied to pixels to the right (with respect to a virtual line passing through the center of the through portion TH) may be provided in a sequence of 20a1, 20aj, 20aj+1, 20aj+2, 20c3, 20c2, and 20c1. Scan signals applied to pixels to the left (with respect to the virtual line passing through the center of the through portion TH) may be provided in a sequence of 20b1, 20bj, 20bj+1, 20bj+2, 20d3, 20d2, and 20d1.

In the above embodiment, a time delay occurs between scan signals applied to the third pixel PX3 and the first pixel PX1. To resolve this time delay, signals may be applied according to an arrangement sequence of scan lines in another embodiment. For example, scan signals applied to the pixels to the right (with respect to the virtual line passing through the center of the through portion TH) may be provided in a sequence of 20a1, 20aj, 20c1, 20aj+1, 20c2, 20aj+2, and 20c3. Scan signals applied to pixels to the left (with respect to the virtual line passing through the center of the through portion TH) may be provided in a sequence of 20b1, 20bj, 20d1, 20bj+1, 20d2, 20bj+2, and 20d3.

Figure 8:
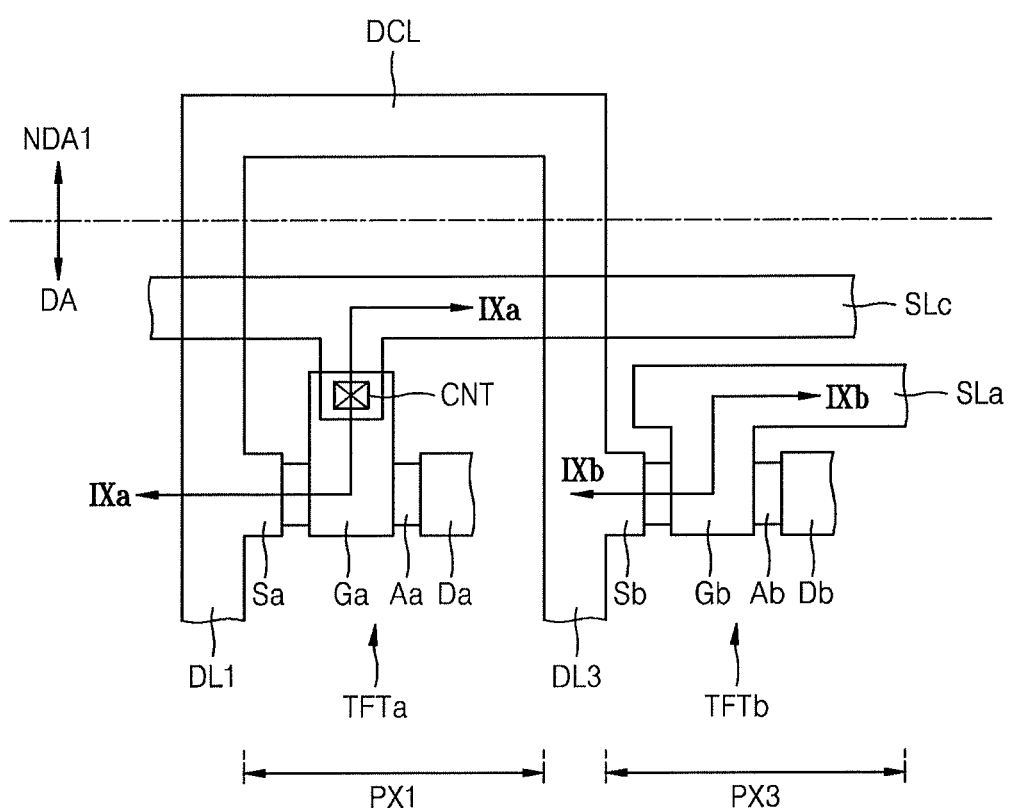
FIG. 8 illustrates an embodiment of a pixel circuit of different pixels.
Figure 9:
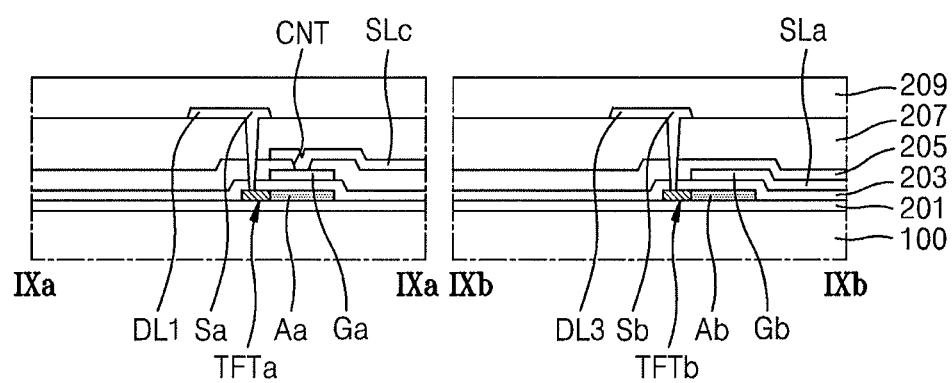
FIG. 9 illustrates a view taken along section lines IXa-IXa and IXb-IXb in FIG. 8.

FIG. 8 illustrates an embodiment which includes a portion of a pixel circuit of a first pixel and a third pixel in a display device, and FIG. 9 is a cross-sectional view taken along lines IXa-IXa and IXb-IXb in FIG. 8. For convenience of description, FIG. 8 illustrates only thin film transistors connected to a scan line and a data line, among a pixel circuit of the first and third pixels PX1 and PX3.

Referring to FIGS. 8 and 9, a thin film transistor TFTa of a first pixel PX1 is connected to a scan line SLc and a first data line DL1, and a thin film transistor TFTb of a third pixel PX3 is connected to a scan line SLa and a third data line DL3.

The thin film transistor TFTa of the first pixel PX1 includes a semiconductor layer Aa, a gate electrode Ga, a source electrode Sa, and a drain electrode Da. The thin film transistor TFTb of the third pixel PX3 includes a semiconductor layer Ab, a gate electrode Gb, a source electrode Sb, and a drain electrode Db. The semiconductor layers Aa and Ab of the thin film transistors TFTa and TFTb include the same material in the same layer. The gate electrodes Ga and Gb include the same material in the same layer. The source and drain electrodes Sa, Sb, Da, and Db include the same material in the same layer.

The first data line DL1 and the third data line DL3 include the same material in the same layer. The first and third data lines DL1 and DL3 are electrically connected to each other via a data connection line DCL integrally formed with the first and third data lines DL1 and DL3. The first and third data lines DL1 and DL3 may include the same material as in first and third data lines DL1 and DL3.

The scan line SLc connected to the first pixel PX1 and the scan line SLa connected to the third pixel PX3 are in different layers, with an insulating layer (for example, a first interlayer insulating layer 205) therebetween. For example, the scan line SLc of the first pixel PX1 is electrically connected to the gate electrode Ga of the thin film transistor TFTa via a contact hole CNT passing through the first interlayer insulating layer 205. A portion of the scan line SLa of the third pixel PX3 may serve as the gate electrode Gb of the thin film transistor TFTb of the third pixel PX3.

Figure 10:
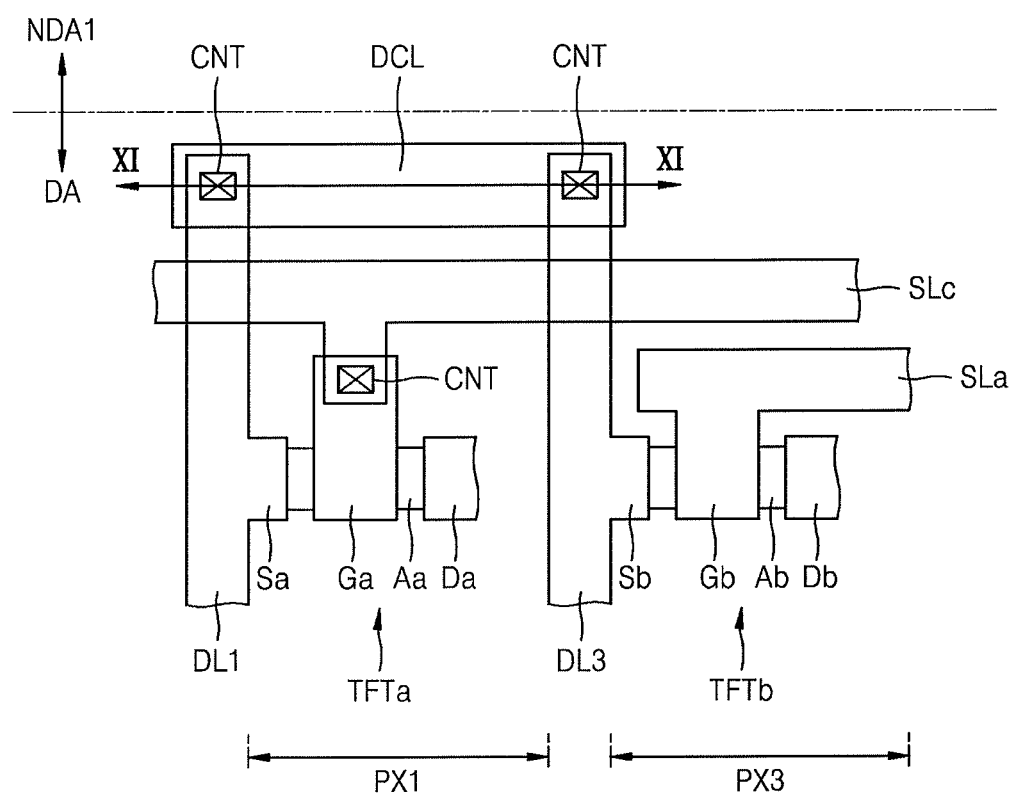
FIG. 10 illustrates another embodiment of a pixel circuit of different pixels.
Figure 11:
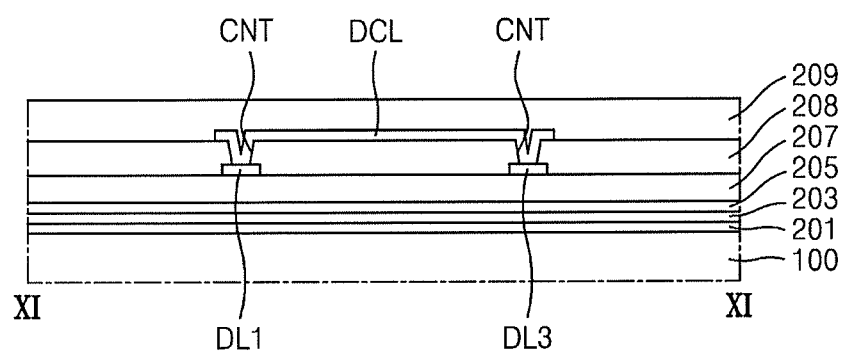
FIG. 11 illustrates a view taken along section line XI-XI in FIG. 10.

FIG. 10 illustrates another embodiment including a portion of a pixel circuit of a first pixel and a third pixel in a display device, and FIG. 11 is a cross-sectional view taken along a line XI-XI of FIG. 10. For convenience of description, FIG. 10 illustrates only thin film transistors connected to a scan line and a data line, among a pixel circuit of the first and third pixels PX1 and PX3. Thin film transistors TFTa and TFTb of the first and third pixels PX1 and PX3, scan lines SLa and SLc, and first and third data lines DL1 and DL3 may be the same as in FIGS. 8 and 9.

Referring to FIGS. 10 and 11, the first and third data lines DL1 and DL3 include the same material in the same layer. However, the data connection line DCL is disposed in a layer different from the layers in which the first and third data lines DL1 and DL3 are disposed. The data connection line DCL is in a layer different from the layers in which the first and third data lines DL1 and DL3 are disposed, with an insulating layer (for example, a second interlayer insulating layer 208) therebetween. The data connection line DCL contacts the first and third data lines DL1 and DL3 via a contact hole CNT passing through the second interlayer insulating layer 208.

The data connection line DCL may be in a display area DA. Since a first sub-non-display area NDA1 does not require a space occupied by the data connection line DCL, the area of the first non-display area NDA1 may be reduced.

Figure 12:
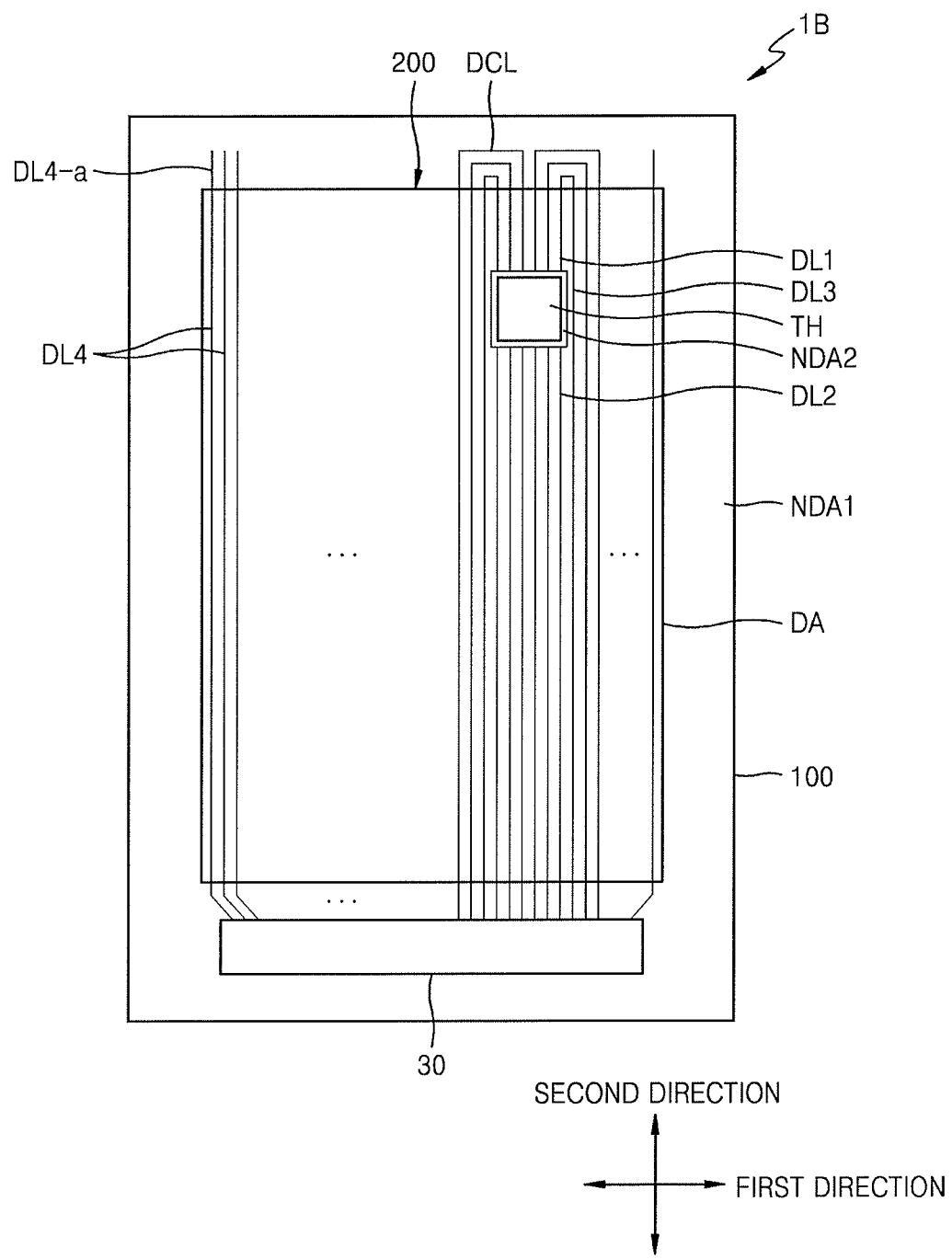
FIGS. 12 and 13 illustrate another embodiment of a display device.
Figure 13:
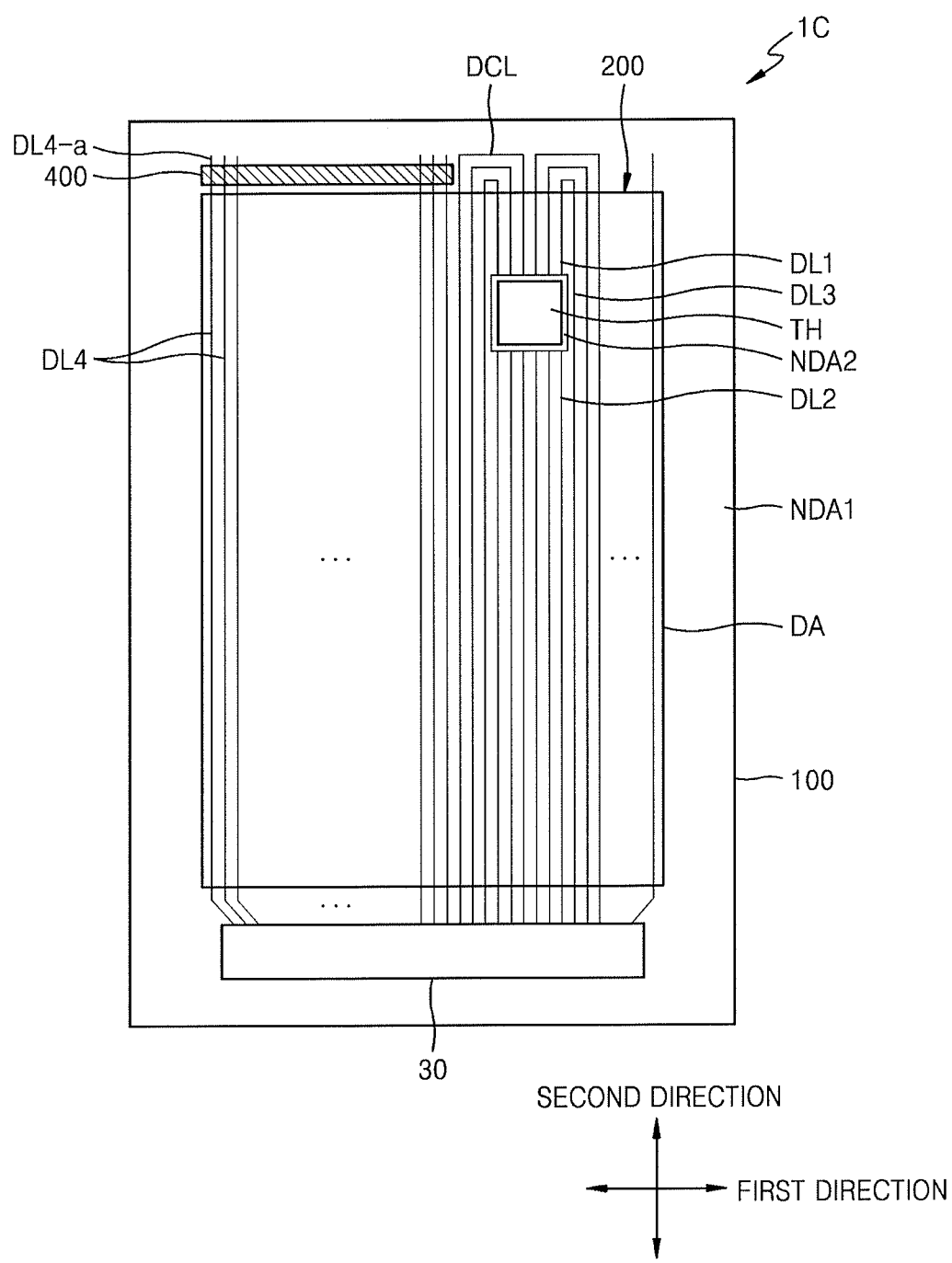

FIGS. 12 and 13 illustrate additional embodiments of display devices 1B and 1C. Referring to FIGS. 12 and 13, like the display device 1A in FIG. 5, each of the display devices 1B and 1C includes first and second data lines DL1 and DL2 disconnected by a through portion TH, and a third data line DL3 spaced apart, along a first direction, from the through portion TH.

The display devices 1B and 1C further include a fourth data line DL4 spaced apart from the through portion TH along the first direction. The fourth data line DL4 is at the opposite side of the through portion TH, with the third data line DL3 therebetween. Unlike the third data line DL3, the fourth data line DL4 is not electrically connected to another data line.

Since the third data line DL3 is connected to the first data line DL1 via the data connection line DCL, RC unbalance between the data lines occurs. To resolve this, one end DL4-a of the fourth data line DL4 may extend outside the display unit 200 across the display unit 200, as in FIG. 12. Since the one end DL4-a of the fourth data line DL4 extends toward an edge of the substrate 100 to be on the first non-display-area NDA1 by a predetermined length, the resistance of the fourth data line DL4 increases. Thus, RC unbalance between the data lines may be resolved.

In another embodiment, as illustrated in FIG. 13, one end DL4-a of the fourth data line DL4 may extend above the first non-display-area NDA1 by a predetermined length and overlap a metallic layer 400. The metallic layer 400 overlaps the one end DL4-a of the fourth data line DL4. A predetermined voltage, for example, power ELVSS, is applied to the metallic layer 400 and induces a parasitic capacitance. The parasitic capacitance induced between the fourth data line DL4 and the metallic layer 400 may resolve the RC unbalance.

Figure 14:
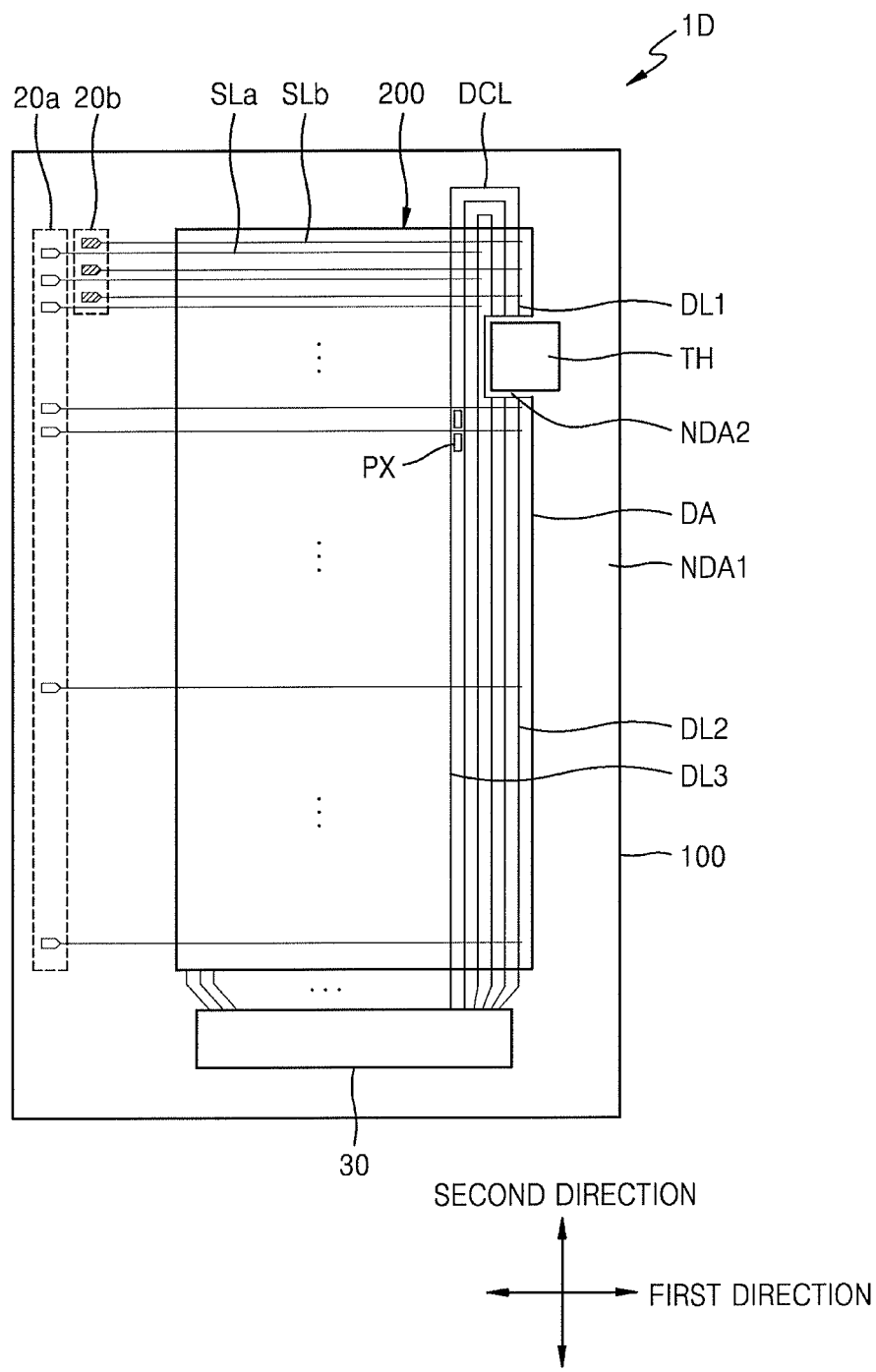
FIGS. 14 and 15 illustrate another embodiment of a display device.
Figure 15:
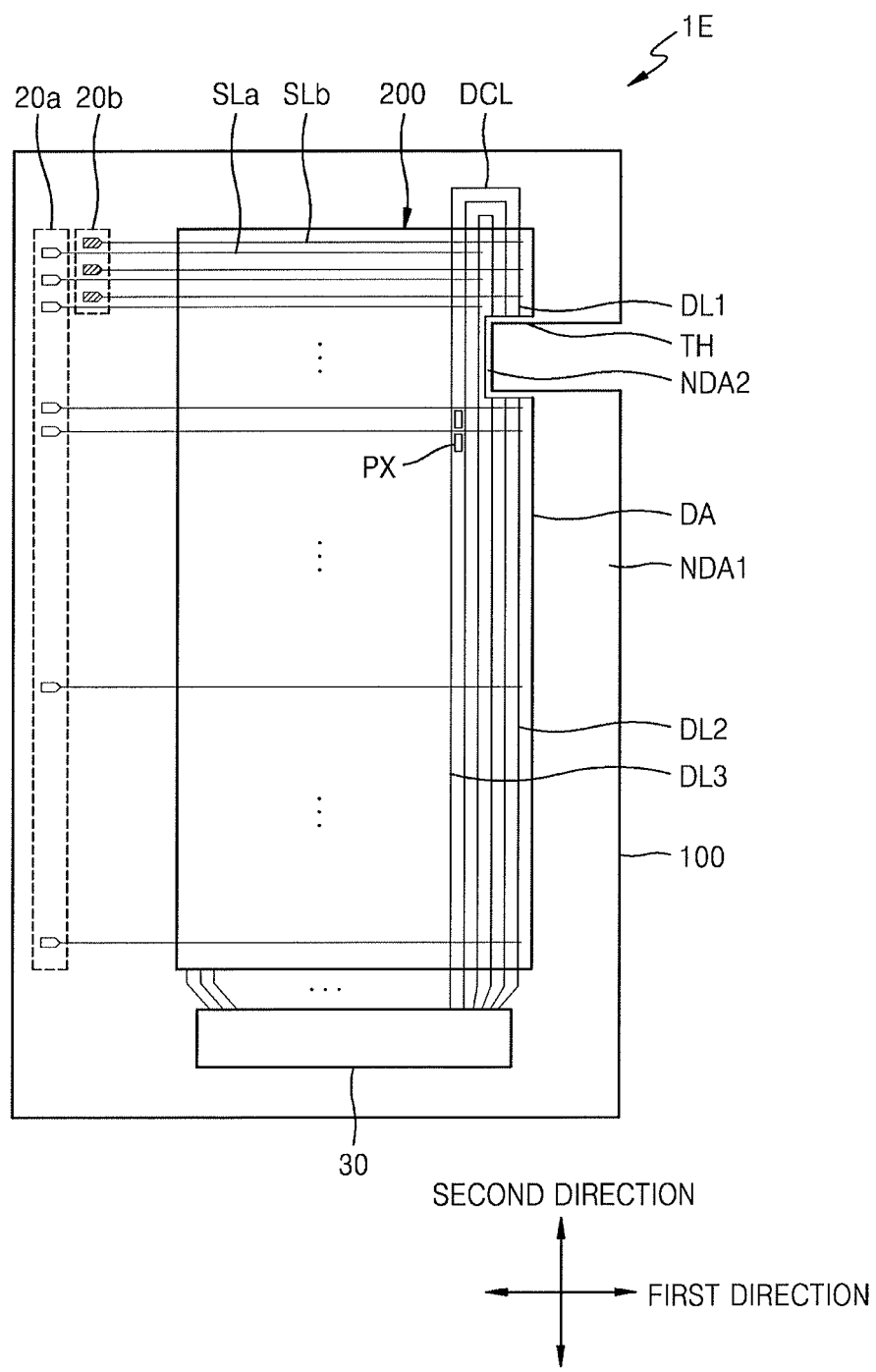

FIGS. 14 and 15 illustrate additional embodiments of display devices 1D and 1E. Referring to FIG. 14, the display device 1D includes the same structure as that of the display device 1 in FIGS. 1 to 4, except for the relationship between a through portion TH and a display unit 200. The display unit 200 of the display device 1D may partially surround the through portion TH.

Referring to FIG. 15, the display device 1E includes the same structure as that of the display device 1 in FIGS. 1 to 4, except for the relationship between a through portion TH and a display unit 200. The display unit 200 of the display device 1E may partially surround the through portion TH. In plan view, the through portion TH may extend up to the edge of the substrate 100. For example, the substrate 100 may be patterned by a region corresponding to the through portion TH.

As illustrated in FIGS. 14 and 15, data lines DL extend in a second direction from a driver 30, and some of the data lines DL are disconnected by the through portion TH. In the plan view of FIG. 14, a first data line DL1 above the through portion TH is disconnected from a second data line DL2 below the through portion TH.

The second data line DL2 is connected to the data driver 30 and transfers a predetermined data signal to a relevant pixel PX connected to the second data line DL2. In contrast, the first data line DL1 is connected by the data connection line DCL to the third data line DL3 spaced apart, along a first direction, from the through portion TH.

Pixels PX connected to the second and third data lines DL2 and DL3 receive a scan signal from a scan line SLa connected to a first scan driver 20a. Pixels PX connected to the first data line DL1 receive a scan signal from a scan line SLb connected to a second scan driver 20b. The connection relationship between the data lines DL and the scan lines SLa and SLb for each pixel may be the same as described with reference to FIGS. 8 to 11.

Figure 16:
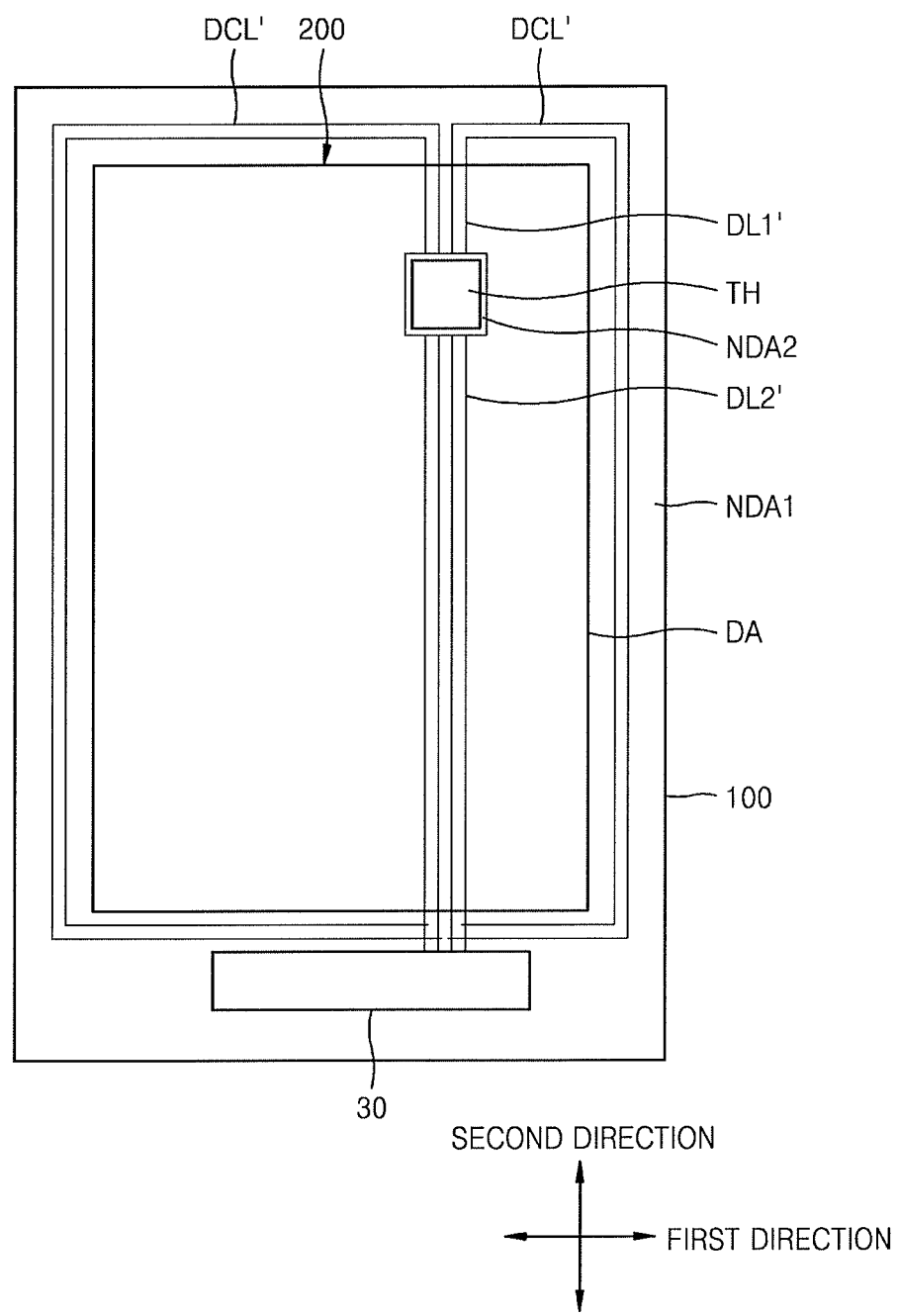
FIGS. 16 and 17 illustrate other types of display devices.
Figure 17:
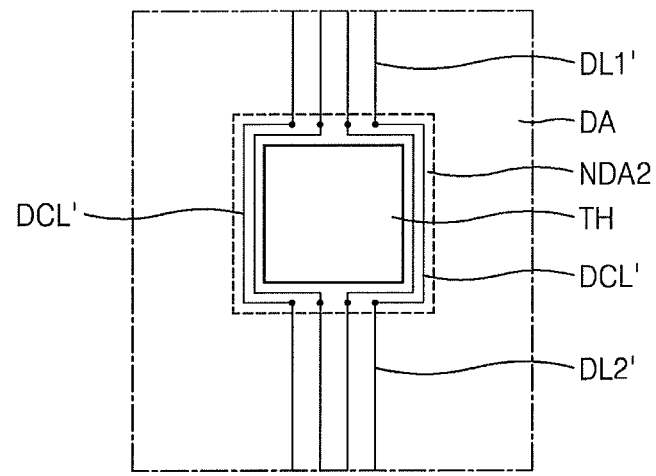

FIGS. 16 and 17 illustrate another embodiment of a display device. Referring to FIG. 16, a first data line DL1' disconnected by a through portion TH may be connected to a second data line DL2' using a data connection line DCL' passing through a first sub-non-display area NDA1.

The data connection line DCL' may connect the first and second data lines DL1' and DL2' across the first sub-non-display area NDA1. In this case, as illustrated in FIG. 16, the area of the first sub-non-display area NDA1 increases. Furthermore, an arrangement space for a scan driver and a data driver is reduced. Thus, overlapping occurs among the data connection line DCL', the scan line, and other data lines.

In another comparison example, the first data line DL1' disconnected by the through portion TH may be connected to the second data line DL2' using a data connection line DCL' passing through a second sub-non-display area NDA2.

Referring to FIG. 17, a data connection line DCL' may connect first and second data lines DL1' and DL2' across the second sub-non-display area NDA2. In this case, as illustrated in FIG. 17, the area of the second sub-non-display area NDA2 is increased in order to secure a space for the data connection lines DCL' detouring the edge of a through portion TH.

However, according to an embodiment, the first data line DL1 disconnected by the through portion TH is electrically connected to the third data line DL3. In this case, the data connection line DCL is in only a portion of the first sub-non-display area NDA1 or in the display area DA. Thus, the area occupied by a dead area, for example, the first sub-non-display area NDA1 or the second sub-non-display area NDA2 in the display device, may be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A display device having a display area from which light is to be emitted, a non-display area, and a first region in the display area, the display device comprising:
    a plurality of light-emitting diodes (LEDs) located at the display area, the plurality of light-emitting diodes comprising a first LED, a second LED, and a third LED, wherein the first LED and the second LED are arranged in a first direction and separated from each other with the first region therebetween;
    a plurality of transistors (TRs) located at the display area, the plurality of transistors comprising a first TR electrically connected to the first LED, a second TR electrically connected to the second LED, and a third TR electrically connected to the third LED;
    a plurality of data lines extending in the first direction, the plurality of data lines comprising a first data line electrically connected to the first TR, a second data line electrically connected to the second TR, and a third data line electrically connected to the third TR; and
    a plurality of scan lines extending in a second direction crossing the first direction,
    wherein the first data line and the second data line are located at the display area and separated from each other with the first region therebetween, and the first data line is electrically connected to the third data line that is located at the display area, and
    wherein the first TR and the third TR are arranged along a same row in the second direction.

2. The display device of claim 1, wherein the first TR and the third TR are arranged adjacent to each other.

3. The display device of claim 2, wherein the plurality of scan lines comprises a first scan line electrically connected to the first TR, a second scan line electrically connected to the second TR, and a third scan line electrically connected to the third TR, wherein a scan signal of the first scan line is independent from a scan signal of the third scan line.

4. The display device of claim 2, wherein the plurality of data lines further comprises a fourth data line adjacent to the third data line, the fourth data line extending across the display area and an end of the fourth data line extending toward the non-display area such that a portion of the fourth data line is located at the non-display area.

5. The display device of claim 4, further comprising:
    a metallic layer located at the non-display area, wherein the metallic layer is configured to induce a parasitic capacitance between the portion of the fourth data line and the metallic layer.

6. The display device of claim 1, further comprising:
    a connection line that connects the first data line to the third data line.

7. The display device of claim 6, wherein a portion of the connection line is in the non-display area.

8. The display device of claim 6, wherein a portion of the non-display area is bent.

9. The display device of claim 1, wherein the first region has a circular shape, an oval shape, or a rectangular shape in a plan view.

10. A display device having a display area from which light is to be emitted, a non-display area, and a first region in the display area, the display device comprising:
- a plurality of data lines extending in a first direction, the plurality of data lines comprising a first data line, a second data line, and a third data line;
- a plurality of scan lines extending in a second direction crossing the first direction; and
- a plurality of pixels located at the display area, each of the plurality of pixels comprising a light emitting element and a pixel circuit that comprises a transistor and a storage capacitor, wherein the plurality of pixels comprises:
- a first pixel comprising a first light emitting element and a first pixel circuit that is electrically connected to the first data line;
- a second pixel comprising a second light emitting element and a second pixel circuit that is electrically connected to the second data line, wherein the first region is between the first data line and the second data line; and
- a third pixel comprising a third light emitting element and a third pixel circuit that is electrically connected to the third data line, wherein the third data line is electrically connected to the first data line,
- wherein the first pixel circuit and the third pixel circuit are arranged along a same row in the second direction.

11. The display device of claim 10, wherein the plurality of scan lines comprises a first scan line electrically connected to the first pixel circuit, a second scan line electrically connected to the second pixel circuit, and a third scan line electrically connected to the third pixel circuit.

12. The display device of claim 11, wherein the first pixel circuit and the third pixel circuit are arranged adjacent to each other.

13. The display device of claim 12, wherein the plurality of pixels further comprises a fourth pixel comprising a fourth light emitting element and a fourth pixel circuit, wherein the fourth pixel circuit is arranged along the same row as the first pixel circuit and the third pixel circuit.

14. The display device of claim 13, wherein the fourth pixel circuit is electrically connected to a fourth scan line, and the first scan line and the fourth scan line are separated from each other with respect to a virtual line that crosses a center of the first region.

15. The display device of claim 11, further comprising:
- a connection line that connects the first data line to the third data line.

16. The display device of claim 15, wherein a portion of the connection line is located at the non-display area.

17. The display device of claim 16, wherein a portion of the non-display area is bent.

18. The display device of claim 11, wherein the plurality of data lines further comprises a fourth data line adjacent to the third data line, the fourth data line extending across the display area and an end of the fourth data line extending toward the non-display area such that a part of the fourth data line is located at the non-display area.

19. The display device of claim 18, further comprising:
- a metallic layer located at the non-display area, wherein the metallic layer is configured to induce a parasitic capacitance between a portion of the fourth data line and the metallic layer.

20. The display device of claim 11, wherein the first region has a circular shape, an oval shape, or a rectangular shape in a plan view.

21. A display device having a display area surrounded by a non-display area and a first region surrounded by the display area, the display device comprising:
- a substrate;
- a plurality of light emitting elements arranged at the display area and located on the substrate;
- a plurality of pixel circuits located at the display area, each of the plurality of pixel circuits being electrically connected to a corresponding light emitting element of the plurality of light emitting elements, the plurality of pixel circuits comprising a first pixel circuit and a second pixel circuit;
- a plurality of scan lines extending in a first direction, the plurality of scan lines comprising a first scan line and a second scan line that are apart from each other with respect to a virtual line along a second direction across the first region;
- a plurality of data lines extending in the second direction, the plurality of data lines comprising a first data line and a second data line that are apart from each other;
- a scan driver circuitry located at the non-display area and comprising a first scan driver configured to drive the first scan line and a second scan driver configured to drive the second scan line, the first and second scan drivers being at opposite sides of the virtual line; and
- a data driver circuitry located at the non-display area,
- wherein the first pixel circuit, which is electrically connected to the first scan line configured to be driven by the first scan driver, and the second pixel circuit, which is electrically connected to the second scan line configured to be driven by the second scan driver, are arranged in a same row in the first direction, the first and second scan lines being electrically disconnected at the virtual line.

22. The display device of claim 21, wherein each of the first and second pixel circuits comprises a driving transistor, a switching transistor, and a storage capacitor overlapping the driving transistor.

23. The display device of claim 21, further comprising:
- an insulation layer between the plurality of scan lines and the plurality of data lines.

24. The display device of claim 21, wherein each of the plurality of light emitting elements comprises an organic light emitting diode.

25. The display device of claim 21, wherein the plurality of scan lines comprises a first scan line group and a second scan line group that are respectively located at opposite sides of the virtual line across the first region, the first scan line being included in the first scan line group and the second scan line being included in the second scan line group, and
- wherein scan lines of the first scan line group are apart from each scan line of the second scan line group with respect to the virtual line across the first region.

* * * * *